United States Patent
Butler et al.

(10) Patent No.: US 9,746,312 B2
(45) Date of Patent: Aug. 29, 2017

(54) LITHOGRAPHIC APPARATUS AND METHOD FOR MEASURING A POSITION

(75) Inventors: Hans Butler, Best (NL); Engelbertus Antonius Franciscus Van Der Pasch, Oirschot (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1900 days.

(21) Appl. No.: 13/022,498

(22) Filed: Feb. 7, 2011

(65) Prior Publication Data

US 2011/0216300 A1 Sep. 8, 2011

Related U.S. Application Data

(60) Provisional application No. 61/310,087, filed on Mar. 3, 2010.

(51) Int. Cl.
*G01B 11/14* (2006.01)
*G03B 27/58* (2006.01)

(52) U.S. Cl.
CPC ............. *G01B 11/14* (2013.01); *G03B 27/58* (2013.01)

(58) Field of Classification Search
CPC ................................................. G03F 7/70775
See application file for complete search history.

(56) References Cited

U.S. PATENT DOCUMENTS 7,075,616 B2 * 7/2006 Derksen .............. G03F 7/70341
355/30
2003/0169434 A1 9/2003 Kume et al.

FOREIGN PATENT DOCUMENTS

| DE | 10 2005 043 569 A1 | 3/2007 |
|---|---|---|
| JP | 2004-101362 | 4/2004 |
| JP | 2004-111653 | 4/2004 |
| WO | 2009/075103 | 6/2009 |

\* cited by examiner

*Primary Examiner* — Chia-How Michael Liu
(74) *Attorney, Agent, or Firm* — Pillsbury Winthrop Shaw Pittman LLP

(57) ABSTRACT

A lithographic apparatus includes a support configured to hold an object, the support being moveable relative to a reference structure in a direction; a first position measurement system configured to provide a first measurement signal in a first frequency range, the first measurement signal representative of a position of the support relative to the reference structure in the direction; a second position measurement system configured to provide a second measurement signal in a second frequency range, the second measurement signal representative of the position of the support relative to the reference structure in the direction; and a processor configured to (a) filter the first measurement signal so as to attenuate a signal component having a frequency in the second frequency range, (b) filter the second measurement signal so as to attenuate a signal component having a frequency in the first frequency range, and (c) combine the filtered first measurement signal and the filtered second measurement signal into a combined measurement signal representative of the position of the support relative to the reference structure in the direction.

17 Claims, 3 Drawing Sheets

LITHOGRAPHIC APPARATUS AND METHOD FOR MEASURING A POSITION

CROSS REFERENCE TO RELATED APPLICATIONS

This application claims priority and benefit under 35 U.S.C. §119(e) to U.S. Provisional Patent Application No. 61/310,087, entitled "Lithographic Apparatus and Method For Measuring A Position", filed on Mar. 3, 2010. The content of that application is incorporated herein in its entirety by reference.

FIELD

The present invention relates to a lithographic apparatus and a method for measuring a position of a support structure relative to a reference structure of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes a support structure to hold an object, e.g. the substrate or the patterning device, wherein the support structure is moveable in a direction relative to a reference structure, e.g. a metrology frame.

The position of the support structure relative to the reference structure can be measured by a position measurement system. However, most position measurement systems have favorable properties in a certain frequency range only, because some position measurement systems are dependent on environmental conditions like pressure and temperature, which are low-frequent phenomena, giving a good position measurement only in a high-frequency range, and other measurement systems are easily disturbed by dynamical behavior like resonances, and therefore only provide accurate measurements in a low-frequency range. The favorable frequency range may limit controller capabilities of a corresponding positioning system, which may be further limited by measured resonances, resulting in a compromised positioning accuracy of the support structure relative to the reference structure.

An example of a position measurement system is an encoder type measurement system including a grating and a sensor head, also referred to as encoder, cooperating with the grating. The grating is usually provided on a plate and attached to the support structure or the reference structure. The sensor head is then provided on the other one of the support structure and reference structure. However, the plate may, due to its design and dimensions, be a relatively non-stiff member sensitive to high-frequency dynamical behavior. Due to this property, the encoder measurement system has a favorable low-frequency behavior. For higher frequencies, the measurement signal no longer represents the real position of the support structure or an object held by the support structure.

When the plates have a dynamical behavior depending on a measurement location on the plates, it may be difficult to find a proper controller that works in all locations.

The favorable frequency range of the position measurement system may also be effected by the measurement location. For example, if the sensor head and plate are not sensitive to dynamic behavior, then the frequency range may still be limited by the dynamics of the part of the support structure to which the sensor head or plate is attached to.

SUMMARY

It is desirable to provide an improved lithographic apparatus, in particular a lithographic apparatus with an increased position accuracy performance.

According to an embodiment of the invention, there is provided a lithographic apparatus including: a reference structure; a support configured to hold an object, the support being moveable relative to the reference structure in a direction; a first position measurement system to provide a first measurement signal corresponding to the position of the support relative to the reference structure in the direction in at least a first frequency range; a second position measurement system to provide a second measurement signal corresponding to the position of the support relative to the reference structure in the direction in at least a second frequency range; and a processor configured to filter the first measurement signal whereby at least signal components having a frequency in the second frequency range are attenuated, to filter the second measurement signal whereby at least signal components having a frequency in the first frequency range are attenuated, and to combine the filtered first measurement signal and the filtered second measurement signal into a combined measurement signal representative of the position of the support structure relative to the reference structure in the direction.

According to another embodiment of the invention, there is provided a method for measuring a position of a moveable support relative to a reference structure in a direction, the method including: providing a first measurement signal representative of the position of the support relative to the reference structure in the direction in at least a first frequency range; providing a second measurement signal representative of the position of the support relative to the reference structure in the direction in at least a second frequency range; filtering the first measurement signal whereby at least signal components in the second frequency range are attenuated; filtering the second measurement signal whereby at least signal components in the first frequency range are attenuated; and combining the filtered first measurement signal with the filtered second measurement signal into a combined measurement signal representative of the position of the support relative to the reference structure in the direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
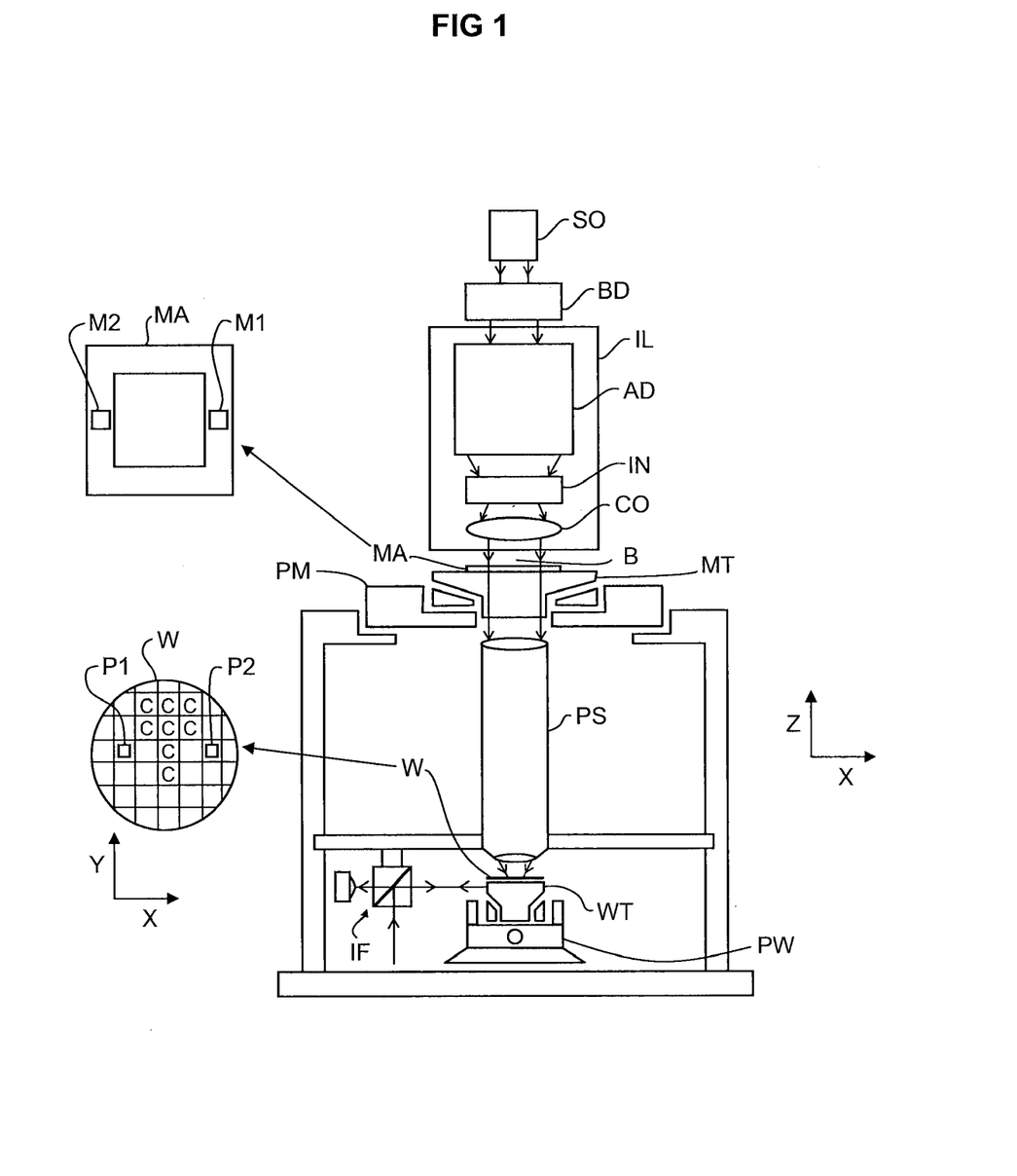
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a support structure in the form of a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW, a first position measurement system FM, and a second position measurement system in the form of a position sensor IF (e.g. an interferometric device, linear encoder or capacitive sensor), the substrate table WT can be moved accurately with respect to a reference structure RS, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device (e.g. mask) MA library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
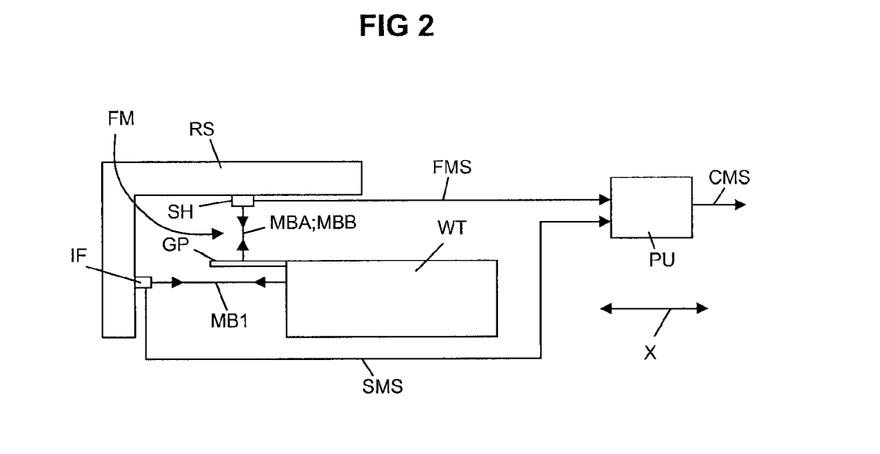
FIG. 2 depicts a block schematic view of a part of the lithographic apparatus of FIG. 1 in accordance with an embodiment of the invention.

FIG. 2 depicts in more detail a part of the lithographic apparatus of FIG. 1. Shown are the substrate table WT and the reference structure RS. The substrate table WT is moveable with respect to the reference structure in a direction X as indicated by the arrow. The position of the substrate table WT relative to the reference structure RS in the direction X is measured by two position measurement systems. The first measurement system FM includes a plate GP with a grating, and a sensor head SH cooperating with the grating. The output of the first measurement system is referred to as first measurement signal FMS.

Figure 3A:
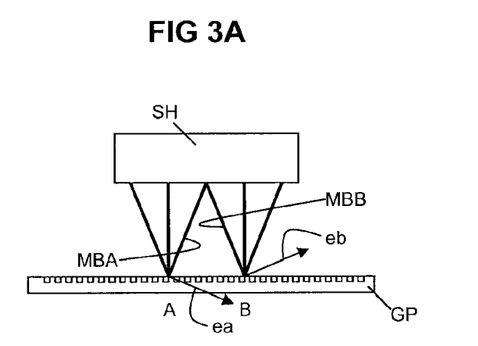
FIG. 3A depicts in more detail an embodiment of a first position measurement system of the lithographic apparatus of FIG. 1.
Figure 3B:
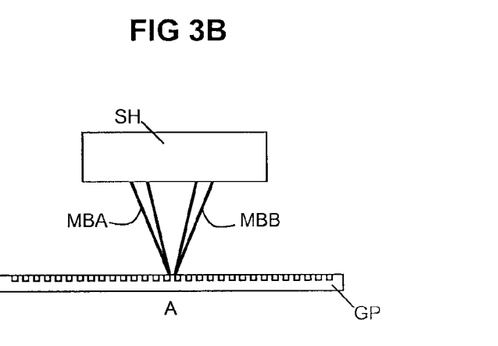
FIG. 3B depicts in more detail another embodiment of a first position measurement system of the lithographic apparatus of FIG. 1.

FIGS. 3A and 3B depict in more detail two possible embodiments of the sensor head SH and the plate GP of FIG. 2. In FIG. 3A, an incremental first position measurement system is applied, providing a periodic sensor head output signal when moving the sensor head with respect to the plate. Position information may be obtained from periodicity and phase of corresponding sensor head output signals of the sensor head. This position information is referred to as the first measurement signal. In the embodiment shown, a sensor head is depicted emitting two measurement beams MBA, MBB towards the plate. Due to an interaction with the pattern on the plate (which may be one dimensional or two dimensional), beams are returned towards the sensor head at an angle, as schematically depicted in FIG. 3A, and detected by a suitable detector of the sensor. Thus, the sensor head provides for two measurements, namely at A and at B on the plate GP.

Each of the measurements provides for a sensitivity in horizontal as well as in vertical direction. A sensitivity of the left one of the sensor elements is schematically indicated by vector ea, while a sensitivity of the right one of the sensor elements is schematically indicated by eb. In a present, practical implementation, an angle of ea and eb with respect to horizontal will be small, smaller than indicated in FIG. 3A. In fact, the angles of ea and eb with respect to the horizontal plane are exaggerated somewhat for illustrative purposes. A measurement of the horizontal position can now be obtained from an addition of ea and eb as outlined in the below expression:

$$posX=k(ea+eb)/2$$

wherein posX represents a horizontal encoder position information, and k represents a gain factor that compensates for the fact that ea and eb are not exactly in the X-direction. By rotating the sensor head SH 90 degrees about an axis substantially perpendicular to the plate, horizontal position information can be obtained in a direction substantially perpendicular to the measurement direction as shown in FIG. 3A, thereby allowing to measure also in an Y direction substantially perpendicular to the X direction using two sensor heads rotated 90 degrees with respect to each other. The embodiment of FIG. 3A is similar to the position measurement system disclosed in DE 10 2005 043 569 A1 of which the content is incorporated by reference in its entirety.

FIG. 3B depicts an alternative embodiment of the incremental first position measurement system of FIG. 3A. Similarly, the position measurement system of FIG. 3B provides a periodic sensor head output signal when moving the sensor head with respect to the plate. Position information may be obtained from periodicity and phase of corresponding sensor head output signals of the sensor head. In the embodiment shown, two measurement beams MBA, MBB are emitted to the plate by sensor head SH. Due to an interaction with the pattern on the plate, a beam is returned towards the sensor head at an angle, as schematically depicted in FIG. 3B. The returned beam may be changed in polarity and may be reflected back to the plate to follow the light path in the opposite direction, i.e. reflect again on the plate GP and return to the sensor head SH so that eventually the measurement beam reflects twice on the plate GP. Inside the sensor head, the two by the plate reflected beams may interfere with each other, and the intensity of the interfered beams may be detected by a suitable detector of the sensor head. The output of the detector can then be used to derive the position relative to the plate. In this embodiment, the sensor head provides for one measurement namely at A on the plate GP. The embodiment of FIG. 3B is similar to the position measurement system as disclosed in US 2003/0169434 A1 the content of which is incorporated by reference in its entirety.

Referring to FIG. 2, the second position measurement system includes in this embodiment an interferometer IF, which uses two measurement beams, one of which is depicted in FIG. 2 and denoted MB1. The measurement beam MB1 is directed towards the substrate table WT and reflects of a mirror (not shown). The returned measurement beam MB1 interferes with the other measurement beam (not shown) in the interferometer. When the position of the substrate table WT changes, a distance of a light path of measurement beam MB1 changes, so the interference also changes, thereby enabling to determine the position change.

Substrate table WT and thus plate GP are subject to relatively large accelerations applied by the second positioning device PW (see FIG. 1). These accelerations in response to actuator forces acting on the substrate table WT cause deformations in the relatively non-stiff plate GP, which will show up as high-frequency resonances in the measurement signal FMS. These resonances impact the maximum closed-loop control performance, in turn impacting the positioning accuracy of substrate table WT with respect to the reference structure RS. In addition, resonances in the substrate table WT itself will also show up more pronounced in the first measurement signal FMS than in the second measurement signal SMS, because the plate GP is located at a less favorable position than the mirror on the substrate table WT reflecting the beam MB1. For example, beam MB1 may be directed towards the center of gravity of the substrate table WT, while the plate GP may be necessarily located at a height coinciding with the top surface of the substrate table WT. Therefore, the first position measurement system only has favorable measurement properties in terms of accuracy for low frequencies. For high frequencies, the deformations will have such an impact on the accuracy that the first measurement signal is no longer representative for the actual position of the substrate table WT relative to the reference structure in the X direction.

Typically, the light path of measurement beam MB1 is relatively large, at least compared to light paths of the measurement beams MBA and MBB of the first position measurement system. This means that the interferometer IF is sensitive to the conditions of the air present in the light path, e.g. temperature, pressure, etc. Temperature changes are usually low-frequency phenomena, so that the interferometer has favorable properties for relatively high frequencies. The output of the second position measurement system is referred to as second measurement signal SMS and corresponds to the position of the substrate table relative to the reference structure.

The frequency range in which the first position measurement signal has favorable properties is referred to as the first frequency range, the frequency range in which the second position measurement signal has favorable properties is referred to as the second frequency range. Preferably, the first and second frequency range are different from each other. In an embodiment, they are adjacent to each other. In an embodiment, they partially overlap.

The first and second measurement signal FMS, SMS are provided to a processing unit or processor PU configured to filter the first measurement signal whereby at least signal components having a frequency in the second frequency range are attenuated, to filter the second measurement signal whereby at least signal components having a frequency in the first frequency range are attenuated, and to combine the filtered first measurement signal and the filtered second measurement signal into a combined measurement signal representative for the position of the support structure relative to the reference structure in the direction.

A benefit of this combination of measurement signals, is that for each frequency component of the measurement signal the position measurement system with the most favorable properties is used as a basis for the combined measurement signal which can be used in a control loop positioning the support structure. In fact, a third frequency range, which is preferably larger than the individual first and second frequency ranges is created in which the measurement signal accurately represents the position of the substrate table relative to the reference structure.

Favorable properties or favorable frequency range all refer to a certain degree of accuracy of the corresponding position measurement system and can be expressed by a predetermined maximum difference between measured position and actual position. When the measured position is within the allowed accuracy band/range, i.e. the difference between measured position and actual position is less than the maximum value, the position measurement system is the to have favorable properties. The difference between measured position and actual position, i.e. the accuracy can also be used to determine the most favorable position measurement system for a given frequency range as the most favorable position measurement system then has the smallest difference between measured position and actual position. In such a case, it is also within the scope of an embodiment of the invention to attenuate the signals of the other position measurement systems in that frequency range more than the signals of the most favorable position measurement system.

Figure 4:
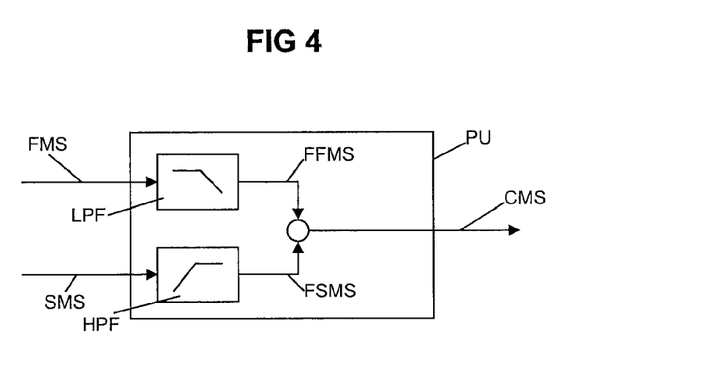
FIG. 4 depicts a block schematic view of a processing unit of the lithographic apparatus of FIG. 1 in accordance with an embodiment of the invention.

FIG. 4 depicts in more detail the processor PU of FIG. 2 in accordance with an embodiment of the invention. The processor PU includes a low-pass filter LPF for the first measurement signal FMS, as the first position measurement system has favorable properties for low frequencies, and a high-pass filter HPF for the second measurement signal SMS, as the second position measurement system has favorable properties for high frequencies. The filtered first measurements signal FFMS and the filtered second measurement signal FSMS are combined by addition of the two signals into the combined measurement signal CMS.

In an embodiment of the invention, the frequency characteristics of the low-pass and high-pass filter are complementary to each other, e.g. the sum of the filters is 1, thereby ensuring a true representation of the position of the substrate table. This also includes filters of which the frequency characteristics are complementary to each other for a predetermined frequency range including the first and second frequency range, as in practice it is not possible to provide filters with a desired frequency characteristic in an infinite frequency range.

In an embodiment, the filters are low-order filters, e.g. a second or third order filter, to minimize the phase disturbance that may be introduced by the filters, especially at a cut-off frequency of the filters.

In an embodiment, a measurement location of the first position measurement system is substantially the same as a measurement location of the second position measurement system. A benefit of this embodiment is that movements in other directions and/or deformations of the substrate table itself have the same or minimal influence on the measurement signals of both measurement systems.

A person skilled in the art will appreciate that measurement signals from different position measurement systems may not be compatible such that they can be combined without any problems. The measurement signals may differ in offset or the measurement systems may have a different sensitivity. It is also possible that e.g. in case of the first position measurement system of FIG. 3, the measurement signal in fact consists of multiple signals. In such cases, the first and second position measurement signal are preferably configured to output similar measurement signals, e.g. correct offset and sensitivity differences. Similar measurement signals have the property that adding the measurement signals results in a combined measurement signal that represents as many times as there are measurement signals the position of the substrate table. For two measurement signals, adding the two measurement signals results in a signal that represents twice the position of the substrate table. These measurement signals can then subsequently be provided to the processing unit to be filtered and combined.

Figure 5:
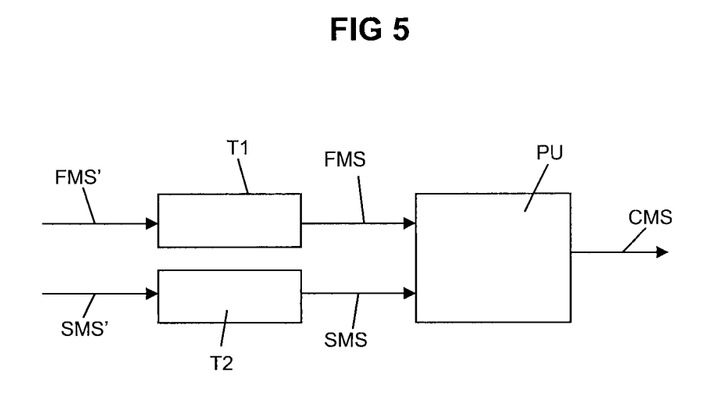
FIG. 5 depicts a block schematic view of a part of the first position measurement system, a part of a second position measurement system, and a processing unit suitable to be used in the lithographic apparatus of FIG. 1 in accordance with an embodiment of the invention.

FIG. 5 depicts schematically the signal flow when two measurement signals are made similar. Sensor elements of the first and second position measurement system output respectively first raw measurement signal FMS' and second raw measurement signal SMS'. These two signals may not be readily combined. Both signals are therefore converted into respectively a first measurement signal FMS by transformation unit T1 and a second measurement signal SMS by transformation unit T2 and subsequently provided to processor PU which, in use, filters and combines the two signals into a combined measurement signal CMS representing the position of the substrate table. The transformation units T1, T2 may be part of the associated first and second position measurement systems as in FIG. 5, but may also be part of the processing unit PU.

In the above described embodiments, the support structure is described as being the substrate table. The same principle however can be applied when the support structure is the patterning device support MT of the patterning device MA. Further, the principle of embodiments of the invention applies to the situations in which the sensor head of the first position measurement system is arranged on the reference structure and the grating is arranged on the support structure, but also to the situation in which the sensor head is arranged on the support structure and the grating is arranged on the reference structure. The same reversal of components of the second position measurement system may apply to the second measurement system.

It is further mentioned that the principle of embodiments of the invention can also be applied to a lithographic apparatus including more than two position measurement systems, each position measurement system having a distinct frequency range in which a measurement signal represents the position of the support structure relative to the reference structure with a certain accuracy, and the processor being configured to filter each corresponding measurement system and combine the filtered measurement signals into a combined measurement signal representative for the position of the support structure.

Further, an embodiment of the invention is described for one direction only. In practice, the support structure may be positioned in more than one direction, even up to six directions, commonly referred to as six degrees of freedom. And the principle of embodiments of the invention can be applied to any direction, and even multiple directions at the same time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing on or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support configured to hold an object, the support being moveable relative to a reference structure in a direction;
   a first position measurement system configured to provide a first measurement signal in a first frequency range, the first measurement signal representative of a position of the support relative to the reference structure in the direction;
   a second position measurement system configured to provide a second measurement signal in a second frequency range, the second measurement signal representative of the position of the support relative to the reference structure in the direction; and
   a processor configured to (a) filter the first measurement signal so as to attenuate a signal component having a frequency in the second frequency range, (b) filter the second measurement signal so as to attenuate a signal component having a frequency in the first frequency range, and (c) combine the filtered first measurement signal and the filtered second measurement signal into a combined measurement signal representative of the position of the support relative to the reference structure in the direction.

2. A lithographic apparatus comprising:
   a support configured to hold an object, the support being moveable relative to a reference structure in a direction;
   a first position measurement system configured to provide a first measurement signal in a first frequency range, the first measurement signal representative of a position of the support relative to the reference structure in the direction;
   a second position measurement system configured to provide a second measurement signal in a second frequency range, the second measurement signal representative of the position of the support relative to the reference structure in the direction; and
   a processor configured to (a) filter the first measurement signal so as to attenuate a signal component having a frequency in the second frequency range, (b) filter the second measurement signal so as to attenuate a signal component having a frequency in the first frequency range, and (c) combine the filtered first measurement signal and the filtered second measurement signal into a combined measurement signal representative of the position of the support relative to the reference structure in the direction, wherein the first measurement system comprises a grating and a sensor head cooperating with the grating, and wherein the processor is configured to low-pass filter the first measurement signal.

3. The lithographic apparatus of claim 2, wherein a frequency characteristic of the filtering of the first measurement signal is complementary to a frequency characteristic of the filtering of the second measurement signal.

4. The lithographic apparatus of claim 2, wherein the sensor head is arranged on the reference structure, and wherein the grating is arranged on the support.

5. The lithographic apparatus of claim 2, wherein the sensor head is arranged on the support, and wherein the grating is arranged on the reference structure.

6. The lithographic apparatus of claim 2, wherein a measurement location of the first position measurement system is substantially the same as a measurement location of the second position measurement system.

7. The lithographic apparatus of claim 2, wherein the first and second measurement signals have a mutual relationship such that a sum of the first and second measurement signals is representative of twice the position of the support relative to the reference structure in the direction.

8. The lithographic apparatus of claim 2, comprising:
   a substrate table constructed to hold a substrate; and
   a projection system configured to project a patterned radiation beam onto a target portion of the substrate, wherein the support is configured to support a patterning device that is adapted to pattern a beam of radiation to form the patterned radiation beam.

9. The lithographic apparatus of claim 2, comprising:
   a patterning device support constructed to support a patterning device, the patterning device being capable of imparting a radiation beam with a pattern in its cross section to form a patterned radiation beam; and
   a projection system configured to project the patterned radiation beam onto a target portion of a substrate, wherein the support is configured to hold the substrate.

10. The lithographic apparatus of claim 2, wherein the combined measurement signal is representative of the position of the support relative to the reference structure in the direction in a third frequency range that is larger than the first and the second frequency range.

11. A lithographic apparatus comprising:
    a support configured to hold an object, the support being moveable relative to a reference structure in a direction;
    a first position measurement system configured to provide a first measurement signal in a first frequency range, the first measurement signal representative of a position of the support relative to the reference structure in the direction;
    a second position measurement system configured to provide a second measurement signal in a second frequency range, the second measurement signal representative of the position of the support relative to the reference structure in the direction; and
    a processor configured to (a) filter the first measurement signal so as to attenuate a signal component having a frequency in the second frequency range, (b) filter the second measurement signal so as to attenuate a signal component having a frequency in the first frequency range, and (c) combine the filtered first measurement signal and the filtered second measurement signal into a combined measurement signal representative of the position of the support relative to the reference structure in the direction, wherein the second measurement system comprises an interferometer, and wherein the processor is configured to high-pass filter the second measurement signal.

12. A method for measuring a position of a moveable support relative to a reference structure in a direction, the method comprising:

provoding a first measurement signal in a first frequency range, the first measurement signal representative of a position of the support relative to the reference structure in the direction;

providing a second measurement signal in a second frequency range, the second measurement signal representative of the position of the support relative to the reference structure in the direction;

filtering the first measurement signal so as to attenuate a signal component in the second frequency range, wherein filtering the first measurement signal comprises low-pass filtering the first measurement signal;

filtering the second measurement signal so as to attenuate a signal component in the first frequency range; and combining the filtered first measurement signal with the filtered second measurement signal into a combined measurement signal representative of the position of the support relative to the reference structure in the direction, wherein the first measurement signal is provided by a grating and a sensor head cooperating with the grating.

13. The method of claim 12, wherein a frequency characteristic of the filtering of the first measurement signal is complementary to a frequency characteristic of the filtering of the second measurement signal.

14. The method of claim 12, wherein the first and second measurement signals have a mutual relationship such that a sum of the first and second measurement signals is representative of twice the position of the support relative to the reference structure in the direction.

15. The method of claim 12, wherein the first measurement system and the second measurement system are configured to provide measurements at substantially a same location.

16. The method of claim 12, wherein the combined measurement signal is representative of the position of the support relative to the reference structure in the direction in a third frequency range that is larger than the individual first and second frequency range.

17. A method for measuring a position of a moveable support relative to a reference structure in a direction, the method comprising:

providing a first measurement signal in a first frequency range, the first measurement signal representative of a position of the support relative to the reference structure in the direction;

providing a second measurement signal in a second frequency range, the second measurement signal representative of the position of the support relative to the reference structure in the direction;

filtering the first measurement signal so as to attenuate a signal component in the second frequency range;

filtering the second measurement signal so as to attenuate a signal component in the first frequency range, wherein filtering the second measurement signal comprises high-pass filtering the second measurement signal; and combining the filtered first measurement signal with the filtered second measurement signal into a combined measurement signal representative of the position of the support relative to the reference structure in the direction, wherein the second measurement signal is provided by an interferometer.

* * * * *

UNITED STATES PATENT AND TRADEMARK OFFICE
CERTIFICATE OF CORRECTION

PATENT NO. : 9,746,312 B2
APPLICATION NO. : 13/022498
DATED : August 29, 2017
INVENTOR(S) : Hans Butler et al.

It is certified that error appears in the above-identified patent and that said Letters Patent is hereby corrected as shown below:

On the Title Page

Item (75) Inventors, Line 1-2:
Replace "Engelbertus Antonius Franciscus VAN DER PASCH"
With --Engelbertus Antonius Fransiscus VAN DER PASCH--.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*